US012169648B2

(12) United States Patent
Basu et al.

(10) Patent No.: US 12,169,648 B2
(45) Date of Patent: Dec. 17, 2024

(54) CACHING FOR MULTIPLE-LEVEL MEMORY DEVICE

(71) Applicant: Micron Technology, Inc., Boise, ID (US)

(72) Inventors: Reshmi Basu, Boise, ID (US); Jonathan S. Parry, Boise, ID (US); Nitul Gohain, Bangalore (IN)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/888,325

(22) Filed: Aug. 15, 2022

(65) Prior Publication Data
US 2024/0053925 A1    Feb. 15, 2024

(51) Int. Cl.
*G06F 3/06* (2006.01)
*G06F 12/02* (2006.01)

(52) U.S. Cl.
CPC .......... *G06F 3/0659* (2013.01); *G06F 3/0604* (2013.01); *G06F 3/0634* (2013.01); *G06F 3/0679* (2013.01); *G06F 12/0253* (2013.01); *G06F 3/0688* (2013.01)

(58) Field of Classification Search
None
See application file for complete search history.

(56) References Cited

U.S. PATENT DOCUMENTS

| | | | | |
|---|---|---|---|---|
| 10,474,386 B1 * | 11/2019 | Hsiao | ..................... | G06F 3/0644 |
| 10,545,685 B2 * | 1/2020 | Tanpairoj | ............ | G06F 12/0811 |
| 11,256,620 B1 * | 2/2022 | Brandt | ................ | G06F 12/0802 |
| 2019/0065080 A1 * | 2/2019 | Tanpairoj | ............ | G06F 12/0246 |
| 2021/0011767 A1 * | 1/2021 | Luo | ........................ | G06F 3/0658 |
| 2021/0200453 A1 * | 7/2021 | Li | ........................ | G06F 12/0246 |
| 2021/0334211 A1 * | 10/2021 | Duan | ................... | G06F 12/0646 |
| 2022/0066638 A1 * | 3/2022 | Luo | ........................ | G06F 3/064 |
| 2022/0188242 A1 * | 6/2022 | Tanpairoj | ............ | G06F 12/0811 |

* cited by examiner

*Primary Examiner* — Christopher D Birkhimer
(74) *Attorney, Agent, or Firm* — Holland & Hart LLP

(57) ABSTRACT

Methods, systems, and devices for caching for a multiple-level memory device are described. First data may be received for writing to a memory device that include multiple-level cells that are programmable using multiple programming modes. Based on receiving the first data, the first data may be written to first multiple-level cells using a first programming mode. Based on writing the first data to the first multiple-level cells, the first data may be transferred from the first multiple-level cells to second multiple-level cells using a third programming mode. Later, second data writing to the memory device may be received. Based on receiving the second data, a determination of whether to write the second data to third multiple-level cells using the first programming mode or a second programming mode may be made based on available multiple-level cells that are ready for programming.

25 Claims, 6 Drawing Sheets

CACHING FOR MULTIPLE-LEVEL MEMORY DEVICE

FIELD OF TECHNOLOGY

The following relates to one or more systems for memory, including caching for a multiple-level memory device.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
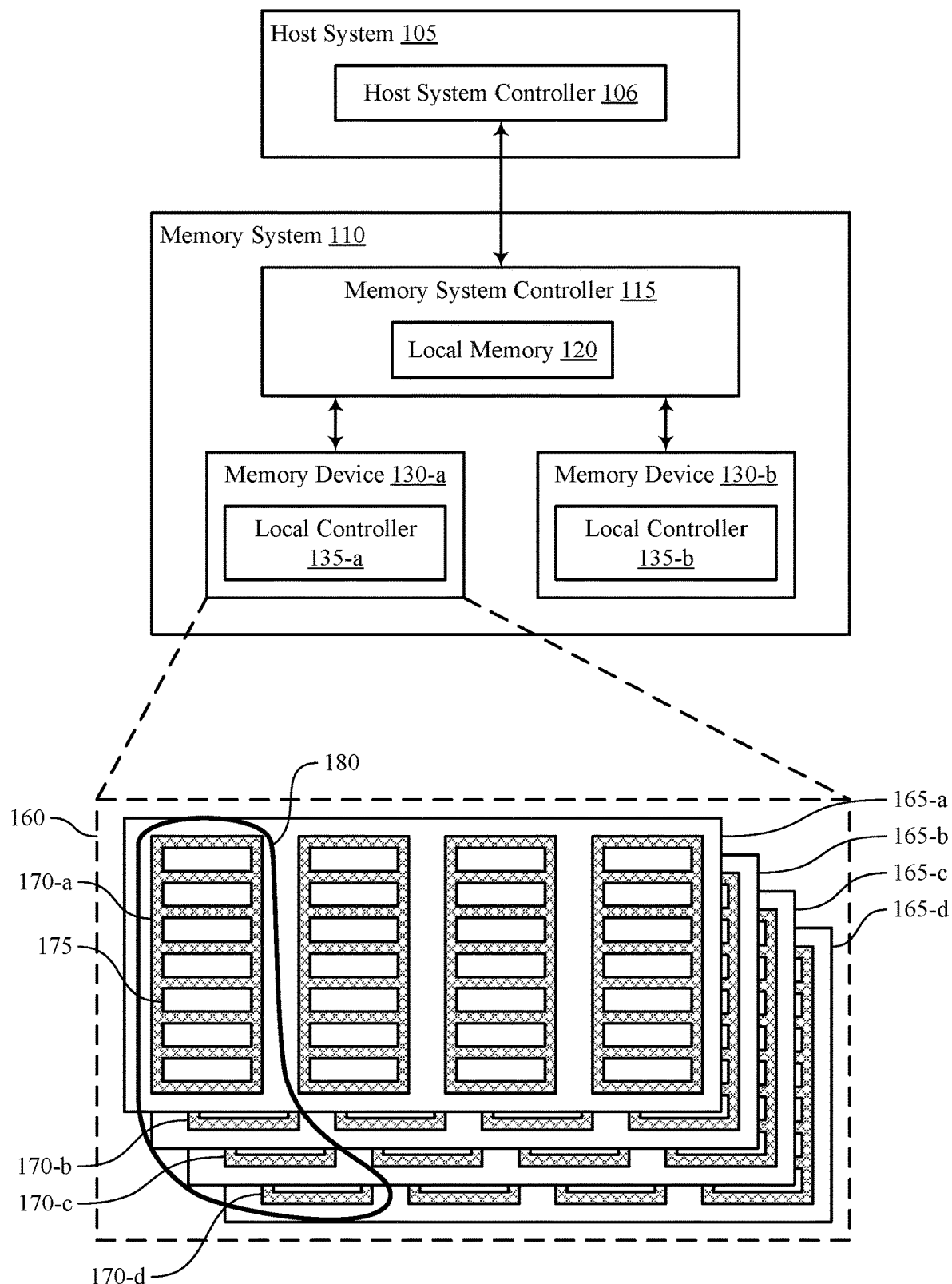
FIG. 1 shows an example of a system that supports caching for a multiple-level memory device in accordance with examples as disclosed herein.

Memory cells in a memory device (e.g., a NAND memory device) may be used to store data. In some examples, the memory cells may each be capable of storing a single bit of data (and may be referred to as single-level memory cells). In some examples, the memory cells may each be capable of storing multiple bits of data (and may be referred to as multiple-level memory cells). In some cases, multiple-level memory cells may be used to store a single-bit of data—e.g., when programmed using single-level techniques. For example, multiple-level memory cells may be used to store a single-bit of data when used for caching data in a memory device before the cached data is stored in multiple-level memory cells using multiple-level programming techniques for longer-term storage.

In some cases, reprogramming a cell may involve erasing the cell prior to writing the new data. Moreover, the operation for erasing the data stored in the memory cell may be time-consuming, and the memory device may be prevented from performing other operations (e.g., read or write operations) while the data is erased. Accordingly, a memory device may strategically erase (during "garbage collection" operation) blocks of memory cells to delete data stored in memory cells of the blocks of memory cells that is no longer valid and to consolidate data stored in memory cells of the blocks of memory cells that is still valid into fewer blocks of memory cells.

In some examples, a memory system may receive a large amount of data to be written to the memory system within a short duration (e.g., within a few seconds). In such cases, if single-level programming techniques are used to cache the data in multiple-level memory cells of the memory system during a caching operation, the memory devices in the memory system may run out of multiple-level cells that are available for caching before all of the data can be written to the memory devices. In some examples, garbage collection, folding operations, or both, may be performed to make available additional multiple-level cells for caching—e.g., multiple-level cells in a block of multiple-level memory cells that store invalid data prior to the garbage collection. However, the additional multiple-level cells may not be made available at a rate that is sufficient to support the rate at which data is being received. Accordingly, the memory system may fail to store data at an expected rate. In some examples, a utilization of the memory system may be above a threshold when data to be written to the memory system is received. In such cases, a likelihood of the memory devices running out of multiple-level cells available for caching may increase.

One option for reducing a likelihood that an amount of multiple-level cells available for caching will be insufficient to accommodate received data is to maintain a quantity of multiple-level cells for overhead operations (which may be referred to as overprovisioning). For example, a quantity of multiple-level cells may be set aside for overhead operations. However, allocating more multiple-level cells to over-provisioning reduces an amount of storage provided by the memory system to a user.

To maintain expected data rates with reduced overprovisioning, different programming modes may be used for caching based on an amount of multiple-level cells at the memory system that are ready for programming. Multiple-level cells that are ready for programming may refer to cells that do not currently store data and can be written to without being garbage collected and erased. In some examples, an amount of multiple-level cells that are ready for programming may be determined based on a logical saturation of the memory system. For example, an amount of multiple-level cells that are ready for programming may be determined as being below a threshold if the logical saturation of the memory system 110 is above a threshold.

FIG. 1 shows an example of a system 100 that supports caching for a multiple-level memory device in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support caching for a multiple-level memory device. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

The host system 105 may store data at the memory system 110 using logical addresses. The memory system 110 may store the data at physical addresses of the memory system 110 corresponding to logical addresses. As described herein, the memory system 110 may maintain a mapping between logical addresses and physical addresses so that the correct data may be accessed when the host system 105 accesses a logical address. The quantity of physical addresses of the memory system 110 may be greater than the quantity of logical addresses available to the host system 105—e.g., so that invalid data may be stored at physical addresses until garbage collection is performed, to support temporary data for storing caching resources, to support storing temporary data folding operations, to support storing temporary data for background operations, etc. In some examples, the quantity of logical addresses (supported by the memory system 110/available to the host system 105) may correspond to the capacity of the memory system 110 that is available to the host system 105.

The memory system 110 may monitor a logical saturation of the memory system 110 during operation. Logical saturation may refer to a quantity of logical addresses that are in use by the host system 105 relative to a quantity of logical address that are available to the host system 105. In some examples, a high logical saturation (e.g., greater than 90% logical saturation) of the memory system 110 may be associated with a high percentage of valid pages in the memory system 110—e.g., high utilization of the logical addresses may imply efficient usage of the physical addresses of the memory system 110. Accordingly, when the logical saturation of the memory system 110 is above a threshold, garbage collection operations may free up less space than when the logical saturation of the memory system is below the threshold.

A memory device (e.g., the memory device 130-$a$) may include memory cells for storing data. The memory cells may be capable of storing one bit of data based on being programmable in two distinct states (and may be referred to as single-level cells). Additionally, or alternatively, the cells may be capable of storing more than one bit of data based on being programmable in more than two distinct states (and may be referred to as multiple-level cells). For example, bi-level cells (which may also be referred to as multi-level cells) may be capable of storing two bits of data based on being programmable in four ($2^2$) distinct states. Tri-level cells may be capable of storing three bits of data based on being programmable in eight ($2^3$) distinct states. Quad-level cells may be capable of storing four bits of data based on being programmable in 16 ($2^4$) distinct states. And so on.

In some examples, the different levels of multiple-level cells are used together to form different pages. For example, a group of tri-level cells may be used to form a lower page that extends across the group of tri-level cells, an extra page that extends across the group of tri-level cells, and an upper page that extends across the group of tri-level cells. And a group of quad-level cells may be used to form a lower page that extends across the group of quad-level cells, an extra page that extends across the group of quad-level cells, an upper page that extends across the group of quad-level cells, and a top page that extends across the group of quad-level cells. The different pages of the multiple-level cells may store information (e.g., codewords) that are distinct from information stored in the other pages of the multiple level cells.

Different programming techniques may be used to program cells of different levels. For example, a one-pass programming technique may be used to program single-level cells while a multiple-pass programming technique may be used to program tri-level cells and quad-level cells. In some examples, a duration for programming higher-level cells (e.g., tri-level cells or quad-level cells) may be increased relative to a duration for programming lower-level cells (e.g., single-level cells). For example, a duration for programming a quad-level cell may be around seventy times greater than a duration for programming a single-level cell. The extended programming durations for higher-level cells may affect a performance of the memory system 110. For example, the memory system 110 may be unable to write data to the memory devices 130 at a rate expected by the host system 105, which may result in delays or computing failures.

To compensate for the delays associated with writing to higher-level cells, available multiple-level cells may be programmed using lower-level programming techniques when data is received. For example, the memory system controller 115 may program the quad-level cells using a single-level programming technique. Thus, after the programming operation, the quad-level cells may each store one bit of data. After the data is written to the multiple-level cells using the lower-level programming technique, the memory system controller 115 may transfer, using higher-level programming techniques, the single-bit data stored in the multiple-level cells to other multiple-level cells. The process of transferring single-bit data to other multiple-level cells may be referred to as folding. For example, the single-bit data stored in the quad-level cells may be transferred to other quad-level cells (or consolidated into one of the quad-level cells) using a quad-level programming technique. Accordingly, the memory system controller 115 may use available multiple-level cells as a cache that can be used to accommodate the reception of large amounts of data within a short period and may move, at a later time, the written data to other multiple-level cells as long-term storage using higher-density programming techniques.

In some examples, the host system 105 may send a large amount of data (e.g., an amount of data that exceeds a capacity of multiple-level memory cells available for caching) to be written to the memory system 110 within a short duration (e.g., within a few seconds). In such cases, if single-level programming techniques are used, the memory devices 130 may run out of multiple-level cells that are available for caching before all of the data can be written to the memory devices 130. In some examples, garbage collection, folding operations, or both, may be performed to make available additional multiple-level cells for caching—e.g., multiple-level cells that store invalid data prior to the garbage collection. However, the additional multiple-level cells may not be made available at a rate that is sufficient to support the rate at which data is being received. Accordingly, the memory system 110 may fail to store data at a rate that is expected by the host system 105.

In some examples, a utilization of the memory system 110 may be above a threshold—e.g., the memory system 110 may be greater than 90% full. As similarly described above, the host system may send a large amount of data (e.g. greater than 10 GBs, 20 GBs, or 30 GBs of data) to be written to the memory system 110 within a short duration. In such cases, the memory devices 130 are likely to run out of multiple-level cells available for caching. Additionally, garbage collection, folding operations, or both, may be less likely (e.g., even if a cadence of garbage collection, folding operations, or both, is increased) to make multiple-level cells available for caching at a sufficient rate because the valid page count within a block is expected to be above a threshold (e.g., greater than 90% valid) when the memory system 110 reaches a threshold utilization level.

One option for reducing a likelihood that an amount of multiple-level cells available for caching will be insufficient to accommodate data received from the host system 105 is to maintain a quantity of multiple-level cells for overhead operations (which may be referred to as overprovisioning). For example, a quantity of multiple-level cells (e.g., greater than 30 GBs worth) may be set aside for overhead operations. However, allocating more multiple-level cells to overprovisioning reduces an amount of storage provided by the memory system 110 to a user.

To maintain expected data rates with reduced overprovisioning, the memory system 110 changes a programming mode used for caching data based on an amount of multiple-level cells at the memory system 110 that are ready for programming (which may also be referred to as available for programming). Multiple-level cells that are ready for programming may refer to cells that do not currently store data and can be written to without being garbage collected and erased. In some examples, the memory system controller 115 determines an amount of multiple-level cells that are ready for programming based on a logical saturation of the memory system 110. For example, the memory system controller 115 may determine that an amount of multiple-level cells that are ready for programming is below a threshold if the logical saturation of the memory system 110 is above a threshold.

In some examples, the memory system controller 115 receives, from the host system 105, data to be written to a memory device (e.g., the memory device 130-a). Based on receiving the data, the memory system controller 115 may write, in a caching operation, the data to multiple-level cells using a single-level programming technique. Writing the data to the multiple-level cells may include sending a single-level write command to the memory device. After writing the data to the multiple-level cells, the memory system controller 115 may transfer, using a quad-level programming technique, the received data from the multiple-level cells to other multiple-level cells, consolidate the received data in one or more of the multiple-level cells, or both.

After receiving the data, the memory system controller 115 may receive, from the host system 105, additional data to be written to the memory device. Based on receiving the second data, the memory system controller 115 may write the additional data to multiple level cells using a tri-level programming technique based on the amount of multiple-level cells at the memory system 110 that are available for programming. Writing the additional data to the multiple-level cells may include sending a tri-level write command to the memory device. In some example, the memory system controller 115 determines to use the tri-level programming technique based on determining that a logical saturation of the memory system 110 is above a threshold logical saturation (e.g., greater than 90% logical saturation).

By switching to the tri-level programming technique, the memory system controller 115 may write more data to the cache and provide more time for garbage collection, folding operations, or both, to make additional multiple-level cells available for caching. Accordingly, data may continue to be stored in the memory system 110 at a rate that is expected by the host system 105.

In some examples, the tri-level programming technique is used to overwrite multiple-level cells that are currently each storing a single-bit data as a result of an earlier cache operation that used a single-level programming technique. When a multiple-level cell storing single-bit data is overwritten the single-bit data may be maintained and recoverable in a pre-read operation. By overwriting multiple-level cells with a tri-level programming technique, the multiple-level cells may store an increased amount of information.

In some examples, when a saturation threshold triggers tri-level programming mode for caching, a tri-level programming technique that uses a particular order may be used. That is, after the tri-level programming mode is configured, the memory system controller 115 may write to lower pages of multiple-level cells that are available for caching using a single-level programming mode. After each of the multiple-level cells has been written to using the single-level programming mode, the memory system controller 115 may overwrite, in a same order, the multiple-level cells using a tri-level overwriting technique that maintains the data in the lower pages of the multiple-level cells while writing data to upper and extra pages of the multiple-level cells. In some examples, the memory system controller 115 may write the multiple-level cells using the tri-level programming technique on a block-by-block basis. That is, after the tri-level programming mode is triggered, the memory system controller 115 may begin writing to a current block using the described tri-level overwriting technique, and then my write a subsequent block using the described tri-level overwriting technique, and so on. By contrast, if the memory system controller 115 write the multiple-level cells on a cache-level, after the tri-level programming mode is triggered, the memory system controller 115 may write the lower pages of all of the multiple-level cells in the cache before write the upper and extra pages of the multiple-level cells. By programming the multiple-level cells in the particular order, the memory system controller 115 may cache data at a first data rate using the single-level programming mode and at a second data rate using the tri-level overwrite technique when there are no multiple-level cells available for caching. The second data rate may be less than the first data rate, but an increased amount of data may be stored in the cache while multiple-level cells are made available using garbage collection, folding operations, or both.

Figure 2:
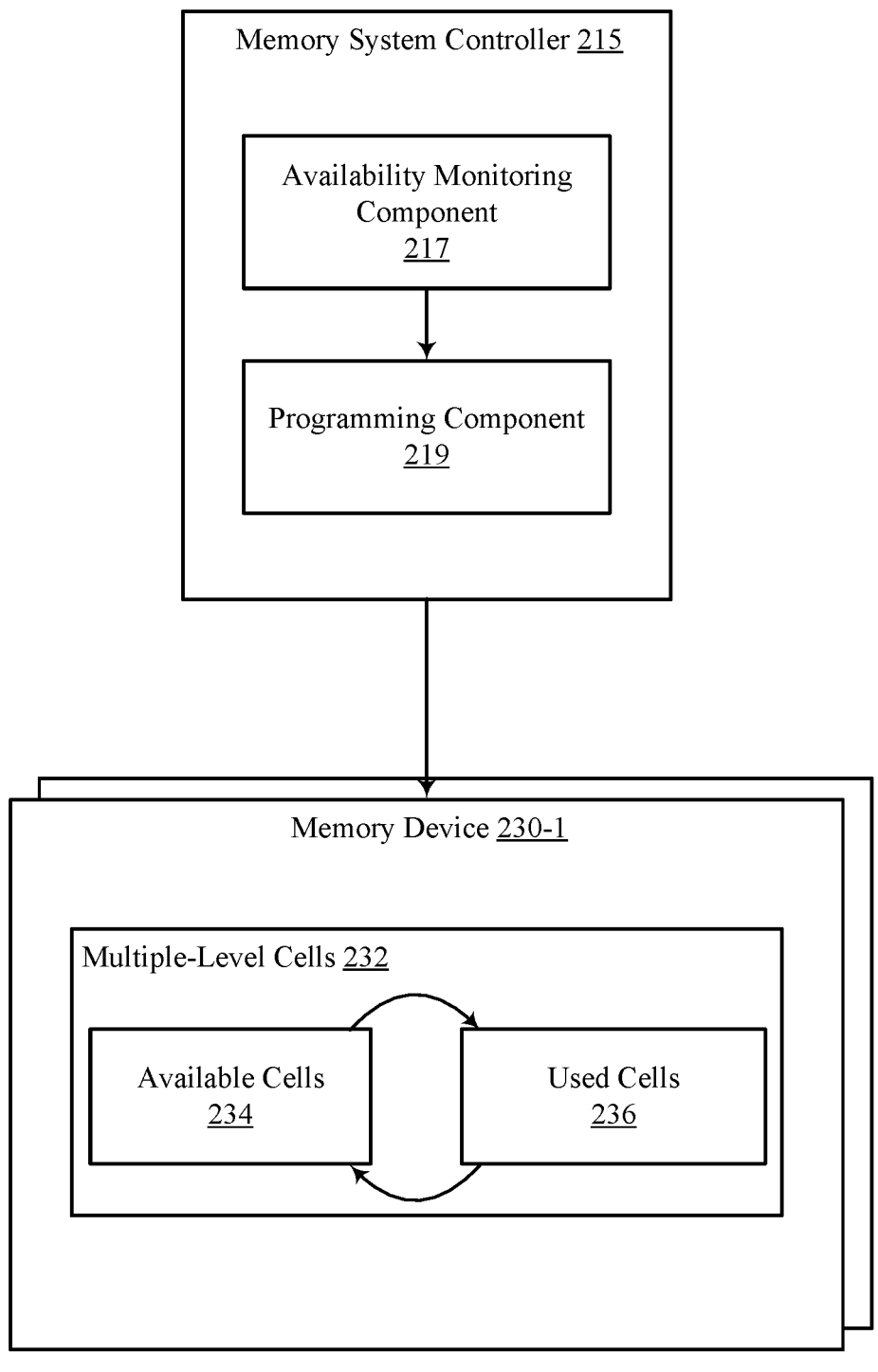
FIG. 2 shows an example of a subsystem that supports caching for a multiple-level memory device in accordance with examples as disclosed herein.

FIG. 2 shows an example of a subsystem that supports caching for a multiple-level memory device in accordance with examples as disclosed herein.

The subsystem 200 includes the memory system controller 215 and the one or more memory devices 230. The memory system controller 215 and the one or more memory devices 230 may be respective examples of the memory system controller and the memory devices as described with reference to FIG. 1.

The first memory device 230-1 may be configured to store data in the multiple-level cells 232 in accordance with commands received from the memory system controller 215. Different commands may be used to trigger different programming techniques at the first memory device 230-1. For example, a single-level programming command may cause the first memory device 230-1 to write data to the multiple-level cells using a single-level programming technique. A tri-level programming command may cause the first memory device 230-1 to write data to the multiple-level cells using a tri-level programming technique. A modified tri-level programming command may cause the first memory device 230-1 to write data to the multiple-level cells using a modified tri-level programming technique (e.g., using a modified programming order). In some examples, the tri-level programming technique may be a single-level to tri-level overwriting technique that maintains data currently written to a lower page of a multiple-level memory cell. A quad-level programming command may cause the first memory device 230-1 to write data to the multiple-level cells using a quad-level programming technique. And so on.

The first memory device 230-1 may include multiple-level cells 232. The multiple-level cells 232 may be cells that are individually capable of storing multiple bits of data (e.g., TLCs, QLCs, etc.). During operation, a portion (e.g., blocks) of the multiple-level cells 232 may be available (which may also be referred to as "free") for storing data while another portion (e.g., other blocks) of the multiple-level cells 232 may be unavailable (which may be referred to as "used") for storing data. The available cells of the multiple-level cells 232 may correspond to the available cells 234 and the unavailable cells of the multiple-level cells 232 may correspond to the used cells 236. In some examples, blocks of the multiple-level cells 232 that are not currently storing data and that are ready for programming (e.g., that are not storing valid or invalid data) may include the available cells 234. Also, blocks of the multiple-level cells 232 that are currently storing valid data or invalid data may include the used cells 236. The portion of the used cells 236 storing valid data may be accessible using a corresponding logical address.

As described herein, garbage collection may be used to reprogram blocks of memory that include a portion of the used cells 236 storing invalid data. After garbage collection, the portion of the used cells 236 storing invalid data may be recategorized as available and included in the available cells 234. As a utilization of the first memory device 230-1 increases (e.g., as more of the logical addresses of the first memory device 230-1 are in use), the percentage of used cells 236 storing invalid data may decrease (e.g., to less than 10%). Thus, the amount of used cells 236 that can be reclaimed using garbage collection may decrease as the utilization of the first memory device 230-1 increases.

In some examples, the memory system controller 215 may configured over-provisioning resources in the first memory device 230 such that a quantity of the available cells 234 is maintained above a threshold (e.g., 10 GB, 20 GB, or 30 GB worth) throughout the operation of the first memory device 230-1. In some cases, the over-provisioning is implemented by designating a group of the multiple-level cells 232 as over-provisioned resources. Additionally, or alternatively, available multiple-level cells may be flexibly included in the over-provisioned resources to ensure that a threshold quantity of the multiple-level cells 232 are available throughout the operation of the first memory device 230-1. Thus, the portion of the multiple-level cells 232 used to satisfy the over-provisioning requirements may change during the operation of the first memory device 230-1. The over-provisioned resources may be used to support the operation of the first memory device 230-1—e.g., to support caching operations, background operations (garbage collection, folding, etc.), system operations, etc.

The memory system controller 215 may be configured to write data to the first memory device 230-1. As part of writing data to the first memory device 230-1, the memory system controller 215 may be configured to temporarily write received data to a portion of the multiple-level cells 232 using a lower-order programming technique—e.g., the memory system controller 215 may write to QLC cells using an SLC programming technique. The portion of the multiple-level cells 232 may correspond to a portion of the available cells 234. Accordingly, the memory system controller 215 may temporarily use the portion of the multiple-level cells 232 as a cache (e.g., an SLC cache) before transferring the cached data to another portion of the multiple-level cells 232 using a programming technique of a corresponding order (e.g., a QLC programming technique). The process of transferring the cached data to the other portion of the multiple-level cells 232 may be referred to as folding. Accordingly, the memory system controller 215 may write data to the first memory device 230-1 at an expected rate (using the caching technique) while also utilizing the storage capacity of the first memory device 230-1 (using the folding technique).

The memory system controller 215 may also be configured to monitor, during operation, an amount of the multiple-level cells 232 that are available for use as a lower-order cache (which may correspond to a quantity of the available cells 234). The memory system controller 215 may be further configured to activate different-order programming modes based on the amount of the multiple-level cells 232 that are available for use as the lower-order cache. For example, based on determining that the amount of the available cells 234 is below a threshold, the memory system controller 215 may be configured to use a higher-order caching technique (e.g., a TLC programming technique). In some examples, the memory system controller 215 is configured to use a modified higher-order caching technique based on determining that the amount of available cells 234 is below a threshold—e.g., a modified TLC or SLC-to-TLC programming technique that uses a particular order. The memory system controller 215 may include an availability monitoring component 217 and a programming component 219.

The programming component 219 may be configured to send programming commands (e.g., single-level programming commands, tri-level programming commands, etc.) to the first memory device 230-1 to write data to the first memory device 230-1. In some examples, the programming component 219 is configured to send lower-level programming commands (e.g., SLC or TLC programming commands) to cache data in the first memory device 230-1 and higher-level programming commands (e.g., QLC commands) to transfer data in the memory device to higher-density storage.

The availability monitoring component 217 may be configured to determine whether an amount of the available cells 234 is sufficient for caching received data. That is, the availability monitoring component 217 may be configured to determine whether the writing the received data to the memory device using a lower-order programming technique (e.g., an SLC programming technique) will exhaust the available cells 234 such that the received data will be unable to be written to the first memory device 230-1 within a threshold duration. In some examples, the availability monitoring component 217 may be configured to determine whether, in addition to a current amount of the available cells 234, an amount of the used cells 236 that can be made available (e.g., using folding or garbage collection) within a duration is sufficient for caching an amount of data to be written to the first memory device 230-1 within the duration.

To determine whether the amount of the available cells 234 is sufficient for caching received data, the availability monitoring component 217 may monitor a logical saturation of the memory system. As described herein, the logical saturation of the memory system may refer to a quantity of logical addresses that are in use (storing data) relative to a quantity of logical address that are available for use. As described herein, in some examples, a high logical saturation level may imply a high utilization and validity level in the memory system such that the amount of the available cells 234 may be low and the amount of the used cells 236 that can be converted to the available cells 234 may also be low. In some examples, the availability monitoring component 217 may determine that the amount of the available cells 234 is below a threshold based on determining that a logical saturation of the memory system is above a threshold.

Based on the availability monitoring component 217 determining that the amount of the available cells 234 is below the threshold, the memory system controller 215 may determine that a different lower-order programming technique should be used for caching. For example, the memory system controller 215 may direct the programming component 219 to second tri-level programming commands (instead of a single-level programming command) to cache data in the first memory device 230-1. By using the tri-level programming commands, the cache of the first memory device 230-1 may be capable of storing more data (and thus may take longer to fill). Also, due to the increased filling duration and, in some examples, also an increased duration of tri-level programming relative to single-level programming, the first memory device 230-1 may be provided additional time to convert a portion of the used cells 236 to the available cells 234 (e.g., using garbage collection, folding, or both).

Figure 3:
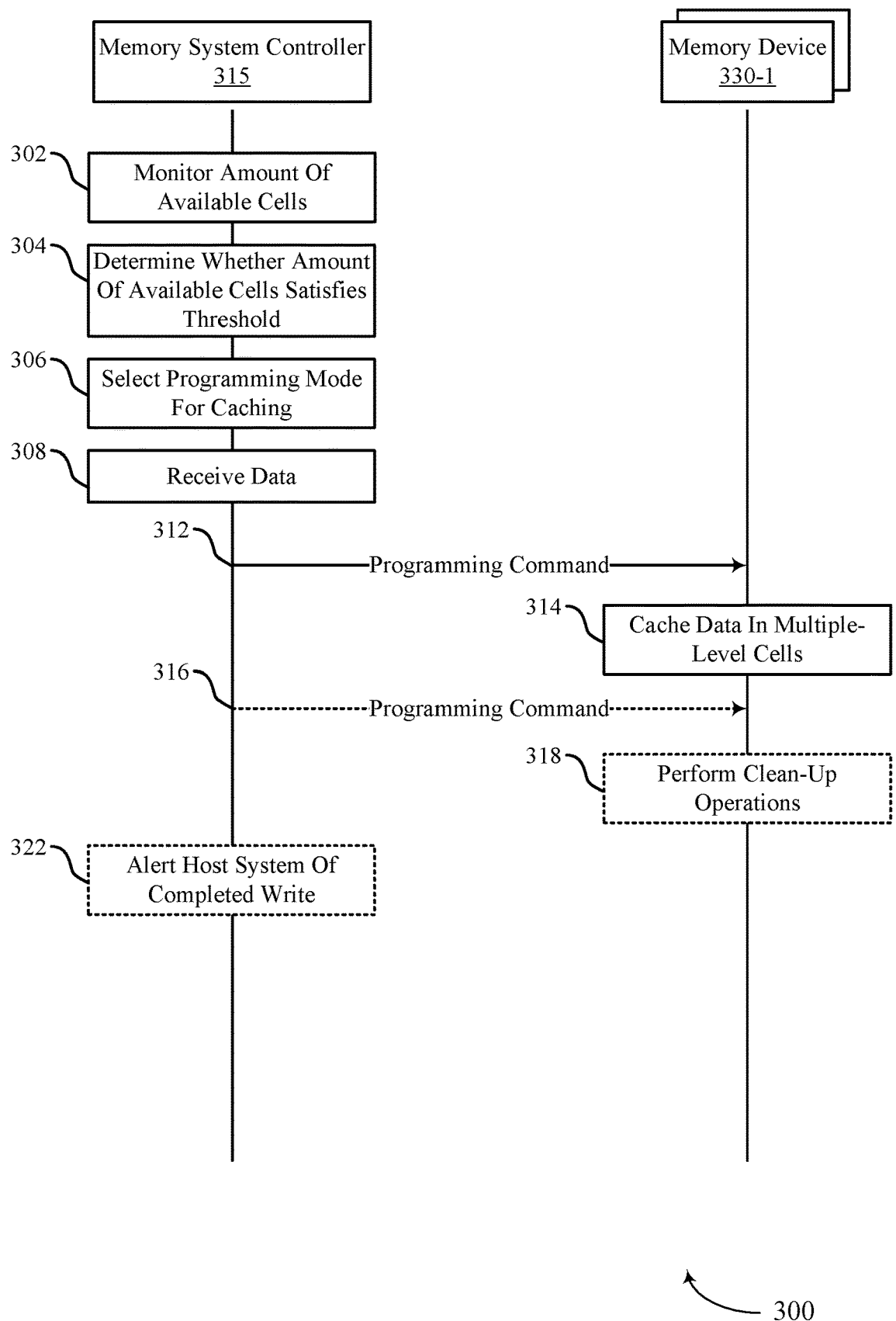
FIG. 3 shows an example of a set of operations for caching in a multiple-level memory device in accordance with examples as disclosed herein.

FIG. 3 shows an example of a set of operations for caching in a multiple-level memory device in accordance with examples as disclosed herein.

The process flow 300 may be performed by the memory system controller 315 and the one or more memory devices 330, which may be respective examples of a memory system controller and a memory device described herein. In some examples, the process flow 300 shows an example set of operations performed to support caching in a multiple-level memory device. For example, the process flow 300 may include operations for determining a programming mode to use for caching based on an amount of available multiple-level cells at a memory device.

Aspects of the process flow 300 may be implemented by a controller, among other components. Additionally, or alternatively, aspects of the process flow 300 may be implemented as instructions stored in memory (e.g., firmware stored in a memory coupled with a controller). For example, the instructions, when executed by a controller, may cause the controller to perform the operations of the process flow 300.

One or more of the operations described in the process flow 300 may be performed earlier or later, omitted, replaced, supplemented, or combined with another operation. Also, additional operations described herein may replace, supplement or be combined with one or more of the operations described in the process flow 300.

At 302, an amount of available cells at a memory system that include the memory devices 330 may be determined—e.g., by an availability monitoring component of the memory system controller 315. In some examples, the amount of available cells may be determined based on determining the quantity of available cells that are not being used to stored valid or invalid data. In some examples, the amount of available cells may be determined based on a logical saturation of the memory system. That is, the logical saturation level of the memory system may imply an amount of available cells in the memory system.

At 304, whether the amount of available cells satisfies a threshold may be determined (e.g., by the memory system controller 315). In some examples, the memory system controller 315 determines that the amount of available cells exceeds a threshold amount. For example, based on a determined quantity of available cells exceeding a threshold quantity (e.g., 30 GB worth of available cells). Or based on a logical saturation level of the memory system satisfying (e.g., exceeding) a logical saturation threshold (e.g., 90% logical saturation).

Alternatively, the memory system controller 315 may determine that the amount of available cells is below a threshold amount. For example, based on the determined quantity of available cells being below the threshold quantity. Or based on the logical saturation level of the memory system satisfying (e.g., being below) the logical saturation threshold.

In some examples, the threshold amount is based on a threshold level of available cells and a rate at which used cells may be converted to available cells relative to a rate at which data may be written to the one or more memory devices 330 using a lower-order programming technique (e.g., SLC or TLC). The threshold amount may be selected so that a large amount of data (e.g., 30 GB of data) may be written (using a lower-order programming technique, such as a TLC programming technique) to the one or more memory devices 330 within a duration expected by a host system. The threshold amount may be selected so that the currently available cells and the used cells that are converted to be available during the duration should be sufficient to store the large amount of data using the lower-order programming technique.

At 306, a programming mode may be selected for caching data in the one or more memory devices 330—e.g., by the memory system controller 315. In some examples, based on determining that the amount of available cells exceeds the threshold amount, the memory system controller 315 may select a single-level programming mode for caching operations. Alternatively, based on determining that the amount of available cells is equal to or below the threshold amount, the memory system controller 315 may select a tri-level programming mode for caching operations. In some examples, the tri-level programming mode is an SLC-to-TLC overwriting mode which may involve maintaining data previously stored in the available cells using a single-level programming technique (in a lower page of the available cells) and writing new data to the available cells using the SLC-to-TLC overwriting technique (in an upper and extra page of the available cells). In some examples, the selected SLC-to-TLC overwriting technique uses a particular programming order that is better-suited for caching operations (as described in more detail herein, including with reference to FIG. 4). In such cases, the selected SLC-to-TLC overwriting technique may involve writing first data to the lower pages of a set of available cells in a block using a single-level programming technique and, once all of the available cells in a block are programmed, writing second data to the upper and extra pages of the set of available cells using a tri-level programming technique that maintains the data written to the lower pages.

At 308, data may be received at the memory system controller 315—e.g., from a host system. In some examples, the received data includes a large amount of information (e.g., >10 GB, 20 GB, or 30 GB). In some examples, the received data includes data being migrated from one device to another device that includes the memory system. In some examples, a size of the large amount of information exceed a capacity of multiple-level cells in the first memory device 330-1 that are available for caching operations.

At 312, a programming command may be sent to the first memory device 330-1 (e.g., from a programming component of the memory system controller 315). The programming command may be a lower-level programming command that is used to cache the received data in the first memory device 330-1. A type of the programming command may be based on the programming mode selected by the memory system controller 315. For example, if a single-level programming mode was selected, then the programming command may be a single-level programming command. Alternatively, if a tri-level programming mode was selected, then the programming command may be a tri-level programming command. Alternatively, if a SLC-to-TLC tri-level programming mode was selected, then the programming command may be a SLC-to-TLC overwrite command. In some examples, the SLC-to-TLC overwrite command may be a modified SLC-to-TLC overwrite command associated with a particular programming order.

In some examples, the logical saturation threshold may be monitored by the memory system controller 315 based on the received data being written to the memory device 330-1. In such cases, the memory system controller 315 may activate a tri-level programming mode for caching data in the memory device 330-1 after determining that the logical saturation threshold has been satisfied.

At 314, the data received from the memory system controller 315 may be cached (e.g., at the first memory device 330-1) in accordance with the received programming command. If the received programming command is a single-level programming command, the first memory device 330-1 may write the received data to available multiple-level cells using a single-level programming technique (which may involve writing lower pages of the available multiple-level cells). If the received programing command is a tri-level programing command, the first memory device 330-1 may write the received data to available multiple-level cells using a tri-level programming technique (which may involve writing lower, upper, and extra pages of the available multiple-level cells). If the received programing command is an SLC-to-TLC overwrite programing command, the first memory device 330-1 may write the received data to available multiple-level cells using the SLC-to-TLC overwriting technique (which may involve writing upper and extra pages of the available multiple-level cells that are currently storing data in lower pages). When using an SLC-to-TLC overwriting technique for a set of multiple-level cells, the first memory device 330-1 may perform a pre-read of the lower page to determine and retain the information stored in the lower page before writing the lower page, upper page, and extra page back to the set of multiple-level cells.

If the received programing command is a modified SLC-to-TLC overwrite programing command, the first memory device 330-1 may write the received data to available multiple-level cells using the modified SLC-to-TLC overwriting technique (which may involve writing to lower, upper, and extra pages of the available multiple-level cells in a particular order. For example, when writing the received data to a block, the first memory device 330-1 may first write a portion of the data to the lower pages of the multiple-level cells in the block and, after writing each of the lower pages, may write the upper and extra pages of the multiple level cells in the block or subblock—e.g., in the same order as the lower pages. This SLC-to-TLC overwriting technique is described in more detail herein and with reference to FIG. 4, which depicts the order in which the lower, upper, and extra pages of the multiple level cells in a block are written. By following this order, the received data may first be written to the lower pages of the available cells with the speed of a single-level programming technique such that the duration between programming an available cell with a single-level programming technique and overwriting the available cell with an SLC-to-TLC overwriting technique may be reduced.

At 316, a second programming command may be sent to the first memory device 330-1 (e.g., from a programming component of the memory system controller 315). The second programming command may be a higher-order programming command (e.g., a quad-level programming command). In some examples, the higher-order programming command may be used to move data stored in the lower-level cache to longer-term, high-density storage —e.g., the higher-order programming command may trigger a folding operation at the memory device).

At 318, clean-up operations may be performed at the first memory device 330-1. The clean-up operations may include garbage collection, folding, and the like. In some examples, the clean-up operations are triggered by the memory system controller 315. In some examples, the clean-up operations may be performed in between or in parallel with the programming operations and may make additional cells available for caching while data is being written to the first memory device 330-1. Additionally, or alternatively, the clean-up operations may be performed while the memory system is in an idle state in preparation of a subsequent write operation.

At 322, the host system may be alerted (e.g., by the memory system controller 315) that the received data has been successfully written to the one or more memory devices 330—e.g., based on writing all of the received data to the cache (or cache and long-term storage) of the one or more memory devices. In some examples, based on using a tri-level programming or SLC-to-TLC overwrite technique to cache the received data, the memory system controller 315 may alert the host system of the completed write within a threshold duration expected by the host system.

Figure 4:
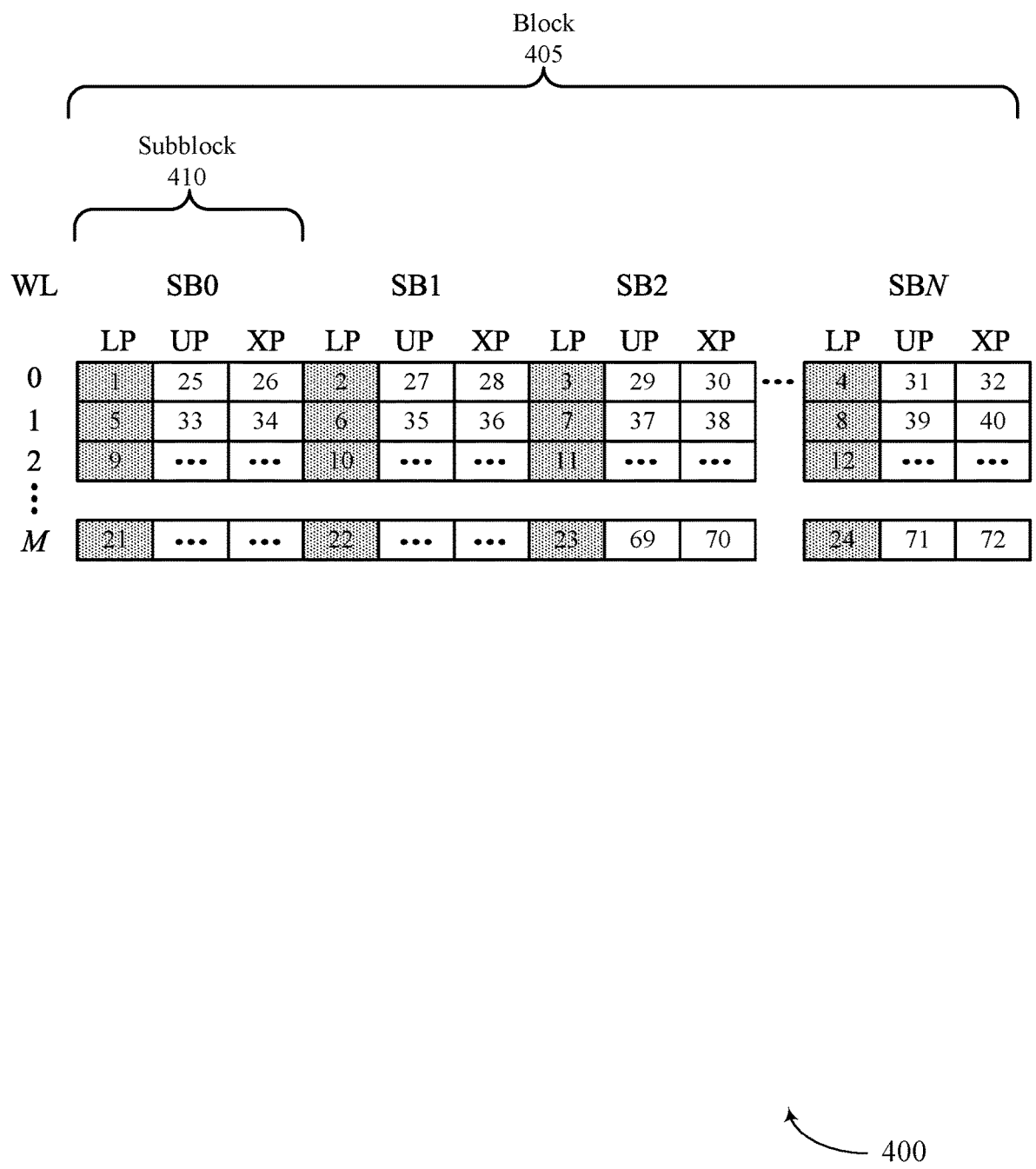
FIG. 4 shows an example of a resource diagram for caching in a multiple-level memory device in accordance with examples as disclosed herein.

FIG. 4 shows an example of a resource diagram for caching in a multiple-level memory device in accordance with examples as disclosed herein.

The resource diagram 400 depicts a block 405 of memory that includes multiple (e.g., N) subblocks 410 of memory. The subblocks 410 may be partitioned into lower pages, upper pages, and extra pages. As described herein, a lower page may extend across a first level of a first set of multiple-level memory cells, an upper page may extend across a second level of the first set of multiple-level memory cells, and an extra page may extend across a third level of the first set of multiple-level memory cells, where each page may be accessible using a word line that corresponds to the first set of multiple-level memory cells. Each block may include multiple (e.g., M) sets of multiple-level memory cells. In some examples, a same word line used to access a first set of multiple-level memory cells in a first subblock 410 is also used to access corresponding first sets of multiple-level memory cells in the other subblocks 410 of the block 405.

The resource diagram 400 further depicts a programming order for the pages in the block 405 when a modified SLC-to-TLC programming mode is enabled. Particularly, the resource diagram 400 depicts that each of the lower pages is written prior to the upper and extra pages in the block 405. The resource diagram 400 also depicts that after each of the lower pages is written, the upper and extra pages are written as a group in the same order that the lower pages were written. For example, after the last lower page (marked as 24) is written, the upper page and extra page (marked as 25 and 26) of the first written lower page (marked as 1) are written, then the upper page and extra page (marked as 27 and 28) of the second written lower page (marked as 2) are written, and so on. By contrast, a standard SLC-to-TLC programming mode may write the upper and extra pages (marked as 25 and 26) of the first written lower page after writing the fifth written lower page (marked as 5), then write the sixth written lower page (marked as 6), then write the upper and extra pages of the second written lower page (marked as 27 and 28), and so on.

As described herein, this programming order enables each of the lower pages to be written with the speed of a single-level programming technique and minimizes the duration between programming the lower pages and the upper and extra pages of a multiple-level cell in the context of first writing each of the lower pages. Extended durations between programming the lower pages and the upper and extra pages of a multiple-level cell may be associated with increased bit errors.

Figure 5:
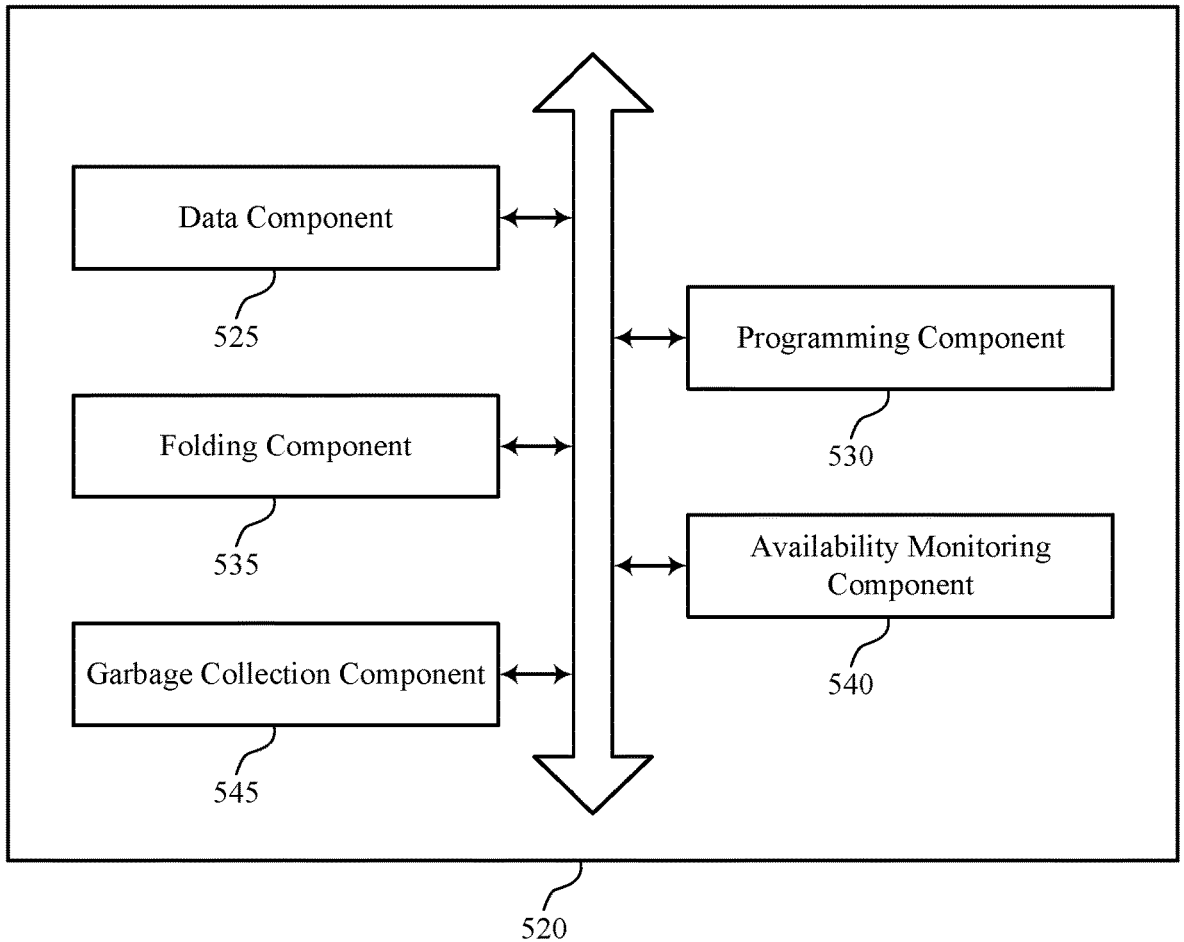
FIG. 5 shows a block diagram of a memory system that supports caching for a multiple-level memory device in accordance with examples as disclosed herein.

FIG. 5 shows a block diagram 500 of a memory system 520 that supports caching for a multiple-level memory device in accordance with examples as disclosed herein. The memory system 520 may be an example of aspects of a memory system as described with reference to FIGS. 1 through 4. The memory system 520, or various components thereof, may be an example of means for performing various aspects of caching for a multiple-level memory device as described herein. For example, the memory system 520 may include a data component 525, a programming component 530, a folding component 535, an availability monitoring component 540, a garbage collection component 545, or any combination thereof. Each of these components may communicate, directly or indirectly, with one another (e.g., via one or more buses).

The data component 525 may be configured as or otherwise support a means for receiving first data to be written to a memory device including a plurality of memory cells. The programming component 530 may be configured as or otherwise support a means for writing, based at least in part on receiving the first data to be written to the memory device, the first data to a first set of cells of the plurality of memory cells using a first, single-level, programming mode. The folding component 535 may be configured as or otherwise support a means for transferring, based at least in part on writing the first data to the first set of cells, the first data from the first set of cells to a second set of cells of the plurality of memory cells using a second, quad-level, programming mode. In some examples, the data component 525 may be configured as or otherwise support a means for receiving, after the first data, second data to be written to the memory device. In some examples, the programming component 530 may be configured as or otherwise support a means for determining whether to write the second data to a third set of cells of the plurality of memory cells using the first programming mode or a third, tri-level, programming mode based at least in part on available cells of the plurality of memory cells that are ready for programming.

In some examples, the programming component 530 may be configured as or otherwise support a means for writing, based at least in part on determining to use the third programming mode, the second data to the third set of cells using the third programming mode.

In some examples, the availability monitoring component 540 may be configured as or otherwise support a means for determining, based at least in part on receiving the second data, a logical saturation of the memory device, where a quantity of the available cells is based at least in part on the logical saturation. In some examples, the availability monitoring component 540 may be configured as or otherwise support a means for comparing the logical saturation with a threshold logical saturation.

In some examples, determining whether to write the second data to the third set of cells using the first programming mode or the third programming mode includes determining to use the third programming mode based at least in part on a logical saturation of the memory device satisfying a threshold logical saturation.

In some examples, the logical saturation of the memory device is based at least in part on a quantity of logical addresses of the memory device that are used relative to a quantity of logical addresses supported by the memory device.

In some examples, the availability monitoring component 540 may be configured as or otherwise support a means for determining, based at least in part on receiving the second data, a quantity of the available cells. In some examples, the availability monitoring component 540 may be configured as or otherwise support a means for comparing the quantity of the available cells with a threshold quantity.

In some examples, determining whether to write the second data to the third set of cells using the first programming mode or the third programming mode includes determining to use the third programming mode based at least in part on a quantity of the available cells being less than a threshold quantity.

In some examples, the garbage collection component 545 may be configured as or otherwise support a means for performing a garbage collection operation while the second data is written to the third set of cells to make available a fourth set of cells for storing the second data.

In some examples, determining whether to write the second data to the third set of cells using the first programming mode or the third programming mode includes determining to use the third programming mode based at least in part on a rate at which unavailable cells are made available being less than a rate at which available cells are written to using the first programming mode.

In some examples, the plurality of memory cells are programmable using a fourth programming mode while programmed using the first programming mode, the fourth programming mode and the third programming mode are tri-level programming modes, the third programming mode being associated with a first order of a lower page and one or more upper pages, and the fourth programming mode being associated with a second, different, order for programming the lower page and the one or more upper pages, and writing, based at least in part on determining to use the third programming mode, the second data to the third set of cells using the third programming mode in accordance with the first order.

In some examples, the programming component 530 may be configured as or otherwise support a means for transmitting a command directing the memory device to use the third programming mode based at least in part on determining to use the third programming mode.

In some examples, the programming component 530 may be configured as or otherwise support a means for programming, in a first round of programming based at least in part on determining to use the third programming mode, first pages of the third set of cells using the first programming mode. In some examples, the programming component 530 may be configured as or otherwise support a means for programming, in a second round of programming in a first round of programming based at least in part on determining to use the third programming mode, second pages, third pages, or both, of the third set of cells.

In some examples, the programming component 530 may be configured as or otherwise support a means for writing the second data to the third set of cells using the third programming mode based at least in part on determining to use the third programming mode. In some examples, the folding component 535 may be configured as or otherwise support a means for transferring, using the second programming mode, the second data to a fourth set of cells of the plurality of memory cells.

In some examples, transferring the second data to the fourth set of cells includes performing a first operation for reading first pages of the third set of cells to obtain a first portion of the second data; and performing a second operation for reading second pages and third pages of the third set of cells to obtain a remaining portion of the second data.

Figure 6:
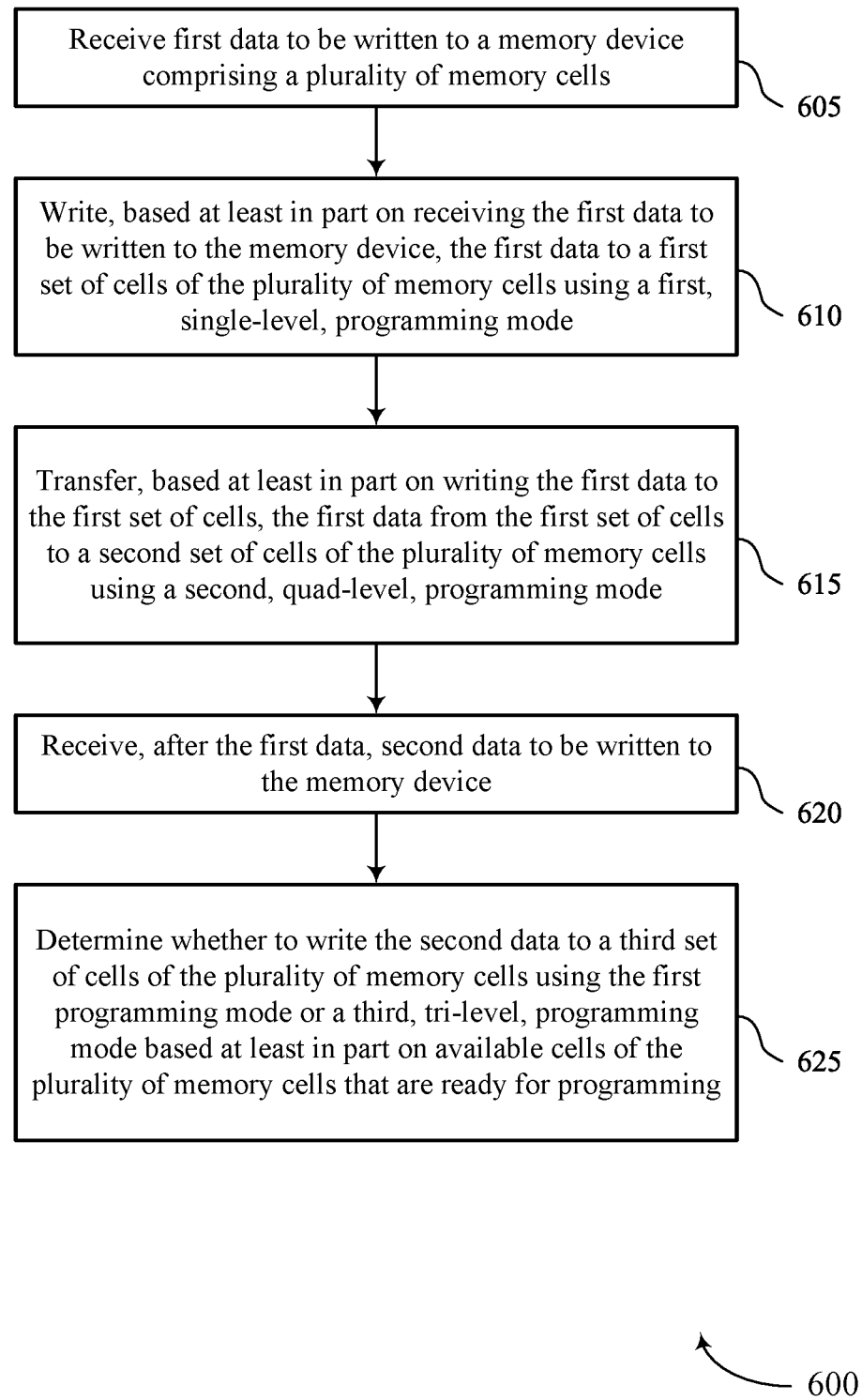
FIG. 6 shows a flowchart illustrating a method or methods that support caching for a multiple-level memory device in accordance with examples as disclosed herein.

FIG. 6 shows a flowchart illustrating a method 600 that supports caching for a multiple-level memory device in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include receiving first data to be written to a memory device including a plurality of memory cells. The operations of 605 may be performed in accordance with examples as disclosed herein. In some examples, aspects of the operations of 605 may be performed by a data component 525 as described with reference to FIG. 5.

At 610, the method may include writing, based at least in part on receiving the first data to be written to the memory device, the first data to a first set of cells of the plurality of memory cells using a first, single-level, programming mode. The operations of 610 may be performed in accordance with examples as disclosed herein. In some examples, aspects of the operations of 610 may be performed by a programming component 530 as described with reference to FIG. 5.

At 615, the method may include transferring, based at least in part on writing the first data to the first set of cells, the first data from the first set of cells to a second set of cells of the plurality of memory cells using a second, quad-level, programming mode. The operations of 615 may be performed in accordance with examples as disclosed herein. In some examples, aspects of the operations of 615 may be performed by a folding component 535 as described with reference to FIG. 5.

At 620, the method may include receiving, after the first data, second data to be written to the memory device. The operations of 620 may be performed in accordance with examples as disclosed herein. In some examples, aspects of the operations of 620 may be performed by a data component 525 as described with reference to FIG. 5.

At 625, the method may include determining whether to write the second data to a third set of cells of the plurality of memory cells using the first programming mode or a third, tri-level, programming mode based at least in part on available cells of the plurality of memory cells that are ready for programming. The operations of 625 may be performed in accordance with examples as disclosed herein. In some examples, aspects of the operations of 625 may be performed by a programming component 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving first data to be written to a memory device including a plurality of memory cells; writing, based at least in part on receiving the first data to be written to the memory device, the first data to a first set of cells of the plurality of memory cells using a first, single-level, programming mode transferring, based at least in part on writing the first data to the first set of cells, the first data from the first set of cells to a second set of cells of the plurality of memory cells using a second, quad-level, programming mode; receiving, after the first data, second data to be written to the memory device; and determining whether to write the second data to a third set of cells of the plurality of memory cells using the first programming mode or a third, tri-level, programming mode based at least in part on available cells of the plurality of memory cells that are ready for programming.

Aspect 2: The method, apparatus, or non-transitory computer-readable medium of aspect 1, further including operations, features, circuitry, logic, means, or instructions, or any combination thereof for writing, based at least in part on determining to use the third programming mode, the second data to the third set of cells using the third programming mode.

Aspect 3: The method, apparatus, or non-transitory computer-readable medium of any of aspects 1 through 2, further including operations, features, circuitry, logic, means, or instructions, or any combination thereof for determining, based at least in part on receiving the second data, a logical saturation of the memory device, where a quantity of the available cells is based at least in part on the logical saturation and comparing the logical saturation with a threshold logical saturation.

Aspect 4: The method, apparatus, or non-transitory computer-readable medium of any of aspects 1 through 3, where determining whether to write the second data to the third set of cells using the first programming mode or the third programming mode includes determining to use the third programming mode based at least in part on a logical saturation of the memory device satisfying a threshold logical saturation.

Aspect 5: The method, apparatus, or non-transitory computer-readable medium of aspect 4, where the logical saturation of the memory device is based at least in part on a quantity of logical addresses of the memory device that are used relative to a quantity of logical addresses supported by the memory device.

Aspect 6: The method, apparatus, or non-transitory computer-readable medium of any of aspects 1 through 5, further including operations, features, circuitry, logic, means, or instructions, or any combination thereof for determining, based at least in part on receiving the second data, a quantity of the available cells and comparing the quantity of the available cells with a threshold quantity.

Aspect 7: The method, apparatus, or non-transitory computer-readable medium of any of aspects 1 through 6, where determining whether to write the second data to the third set of cells using the first programming mode or the third programming mode includes determining to use the third programming mode based at least in part on a quantity of the available cells being less than a threshold quantity.

Aspect 8: The method, apparatus, or non-transitory computer-readable medium of any of aspects 1 through 7, further including operations, features, circuitry, logic, means, or instructions, or any combination thereof for performing a garbage collection operation while the second data is written to the third set of cells to make available a fourth set of cells for storing the second data.

Aspect 9: The method, apparatus, or non-transitory computer-readable medium of any of aspects 1 through 8, where determining whether to write the second data to the third set of cells using the first programming mode or the third programming mode includes determining to use the third programming mode based at least in part on a rate at which unavailable cells are made available being less than a rate at which available cells are written to using the first programming mode.

Aspect 10: The method, apparatus, or non-transitory computer-readable medium of any of aspects 1 through 9, where the plurality of memory cells are programmable using a fourth programming mode while programmed using the first programming mode, the fourth programming mode and the third programming mode are tri-level programming modes, the third programming mode being associated with a first order of a lower page and one or more upper pages, and the fourth programming mode being associated with a second, different, order for programming the lower page and the one or more upper pages, and writing, based at least in part on determining to use the third programming mode, the second data to the third set of cells using the third programming mode in accordance with the first order.

Aspect 11: The method, apparatus, or non-transitory computer-readable medium of aspect 10, further including operations, features, circuitry, logic, means, or instructions, or any combination thereof for transmitting a command directing the memory device to use the third programming mode based at least in part on determining to use the third programming mode.

Aspect 12: The method, apparatus, or non-transitory computer-readable medium of any of aspects 1 through 11, further including operations, features, circuitry, logic, means, or instructions, or any combination thereof for programming, in a first round of programming based at least in part on determining to use the third programming mode, first pages of the third set of cells using the first programming mode and programming, in a second round of programming in a first round of programming based at least in part on determining to use the third programming mode, second pages, third pages, or both, of the third set of cells.

Aspect 13: The method, apparatus, or non-transitory computer-readable medium of any of aspects 1 through 12, further including operations, features, circuitry, logic, means, or instructions, or any combination thereof for writing the second data to the third set of cells using the third programming mode based at least in part on determining to use the third programming mode and transferring, using the second programming mode, the second data to a fourth set of cells of the plurality of memory cells.

Aspect 14: The method, apparatus, or non-transitory computer-readable medium of aspect 13, where transferring the second data to the fourth set of cells includes performing a first operation for reading first pages of the third set of cells to obtain a first portion of the second data; and performing a second operation for reading second pages and third pages of the third set of cells to obtain a remaining portion of the second data.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 15: An apparatus, including: a memory device including a plurality of memory cells; and a controller configured to cause the apparatus to: receive first data to be written to the memory device; write, based at least in part on receiving the first data to be written to the memory device, the first data to a first set of cells of the plurality of memory cells using a first, single-level, programming mode; transfer, based at least in part on writing the first data to the first set of cells, the first data from the first set of cells to a second set of cells of the plurality of memory cells using a second, quad-level, programming mode; receive, after receiving the first data, second data to be written to the memory device; and determine whether to write the second data to a third set of cells of the plurality of memory cells using the first programming mode or a third, tri-level, programming mode based at least in part on available cells of the plurality of memory cells that are ready for programming.

Aspect 16: The apparatus of aspect 15, where the controller is further configured to cause the apparatus to: write, based at least in part on determining to use the third programming mode, the second data to the third set of cells using the third programming mode.

Aspect 17: The apparatus of any of aspects 15 through 16, where the controller is further configured to cause the apparatus to: determine, based at least in part on receiving the second data, a logical saturation of the memory device, where a quantity of the available cells is based at least in part on the logical saturation; and compare the logical saturation with a threshold logical saturation.

Aspect 18: The apparatus of any of aspects 15 through 17, where, as part of determining whether to use the first programming mode or the third programming mode, the controller is further configured: determine to use the third programming mode based at least in part on a logical saturation of the memory device satisfying a threshold logical saturation.

Aspect 19: The apparatus of aspect 18, where the logical saturation of the memory device is based at least in part on a quantity of logical addresses of the memory device that are used relative to a quantity of logical addresses supported by the memory device.

Aspect 20: The apparatus of any of aspects 15 through 19, where the controller is further configured to cause the apparatus to: determine, based at least in part on receiving the second data, a quantity of the available cells; and compare the quantity of the available cells with a threshold quantity.

Aspect 21: The apparatus of any of aspects 15 through 20, where, as part of determining whether to use the first programming mode or the third programming mode, the controller is further configured: determine to use the third programming mode based at least in part on a quantity of the available cells being less than a threshold quantity.

Aspect 22: The apparatus of any of aspects 15 through 21, where the controller is further configured to cause the apparatus to: perform a garbage collection operation while the second data is written to the third set of cells to make available a fourth set of cells for storing the second data.

Aspect 23: The apparatus of any of aspects 15 through 22, where, as part of determining whether to use the first programming mode or the third programming mode, the controller is further configured to: determine to use the third programming mode based at least in part on a rate at which unavailable cells are made available being less than a rate at which available cells are written to using the first programming mode.

Aspect 24: The apparatus of any of aspects 15 through 23, where: the plurality of memory cells are programmable using a fourth programming mode while programmed using the first programming mode, the fourth programming mode and the third programming mode are tri-level programming modes, the third programming mode being associated with a first order of a lower page and one or more upper pages, and the fourth programming mode being associated with a second, different, order for programming the lower page and the one or more upper pages, and the controller is further configured to cause the apparatus to write, based at least in part on determining to use the third programming mode, the second data to the third set of cells using the third programming mode in accordance with the first order.

Aspect 25: The apparatus of aspect 24, where the controller is further configured to cause the apparatus to: transmit a command directing the memory device to use the third programming mode based at least in part on determining to use the third programming mode.

Aspect 26: The apparatus of any of aspects 15 through 25, where, based at least in part on determining to use the third programming mode, the controller is further configured to cause the apparatus to: program, in a first round of programming, first pages of the third set of cells using the first programming mode; and program, in a second round of programming, second pages, third pages, or both, of the third set of cells.

Aspect 27: The apparatus of any of aspects 15 through 26, where the controller is further configured to cause the apparatus to: write the second data to the third set of cells using the third programming mode based at least in part on determining to use the third programming mode; and transfer, using the second programming mode, the second data to a fourth set of cells of the plurality of memory cells.

Aspect 28: The apparatus of aspect 27, where, to transfer the second data to the fourth set of cells, the controller is further configured to cause the apparatus to: perform a first operation for reading first pages of the third set of cells to obtain a first portion of the second data; and perform a second operation for reading second pages and third pages of the third set of cells to obtain a remaining portion of the second data.

An apparatus is described. The following provides an overview of aspects of the apparatus as described herein:

Aspect 29: A non-transitory, computer-readable medium storing code including instructions which, when executed by a processor of an electronic device, cause the electronic device to: receive first data to be written to a memory device including a plurality of memory cells; write, based at least in part on receiving the first data to be written to the memory device, the first data to a first set of cells of the plurality of memory cells using a first, single-level, programming mode; transfer, based at least in part on writing the first data to the first set of cells, the first data from the first set of cells to a second set of cells of the plurality of memory cells using a second, quad-level, programming mode; receive, after the first data, second data to be written to the memory device; and determine whether to write the second data to a third set of cells of the plurality of memory cells using the first programming mode or a third, tri-level, programming mode based at least in part on available cells of the plurality of memory cells that are ready for programming.

Aspect 30: The non-transitory, computer-readable medium of aspect 29, where the instructions, when executed by the processor of the electronic device, further cause the electronic device to: write, based at least in part on determining to use the third programming mode, the second data to the third set of cells using the third programming mode.

Aspect 31: The non-transitory, computer-readable medium of any of aspects 29 through 30, where, as part of determining whether to use the first programming mode or the third programming mode, the instructions, when executed by the processor of the electronic device, further cause the electronic device to: determine to use the third programming mode based at least in part on a logical saturation of the memory device satisfying a threshold logical saturation.

Aspect 32: The non-transitory, computer-readable medium of aspect 31, where the logical saturation of the memory device is based at least in part on a quantity of logical addresses of the memory device that are used relative to a quantity of logical addresses supported by the memory device.

Aspect 33: The non-transitory, computer-readable medium of any of aspects 29 through 32, where the instructions, when executed by the processor of the electronic device, further cause the electronic device to: determine, based at least in part on receiving the second data, a quantity of the available cells; and compare the quantity of the available cells with a threshold quantity.

Aspect 34: The non-transitory, computer-readable medium of any of aspects 29 through 33, where, as part of determining whether to use the first programming mode or the third programming mode, the instructions, when executed by the processor of the electronic device, further cause the electronic device to: determine to use the third programming mode based at least in part on a quantity of the available cells being less than a threshold quantity.

Aspect 35: The non-transitory, computer-readable medium of any of aspects 29 through 34, where the instructions, when executed by the processor of the electronic device, further cause the electronic device to: perform a garbage collection operation while the second data is written to the third set of cells to make available a fourth set of cells for storing the second data.

Aspect 36: The non-transitory, computer-readable medium of any of aspects 29 through 35, where, as part of determining whether to use the first programming mode or the third programming mode, the instructions, when executed by the processor of the electronic device, further cause the electronic device to: determine to use the third programming mode based at least in part on a rate at which unavailable cells are made available being less than a rate at which available cells are written to using the first programming mode.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

As used herein, the term "substantially" means that the modified characteristic (e.g., a verb or adjective modified by the term substantially) need not be absolute but is close enough to achieve the advantages of the characteristic.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
   one or more memory devices comprising a plurality of memory cells; and
   processing circuitry coupled with the one or more memory devices and configured to cause the memory system to:
   receive first data to be written to the one or more memory devices;
   write, based at least in part on receiving the first data to be written to the one or more memory devices, the first data to a first set of cells of the plurality of memory cells using a first programming mode, the first programming mode being a single-level programming mode;
   transfer, based at least in part on writing the first data to the first set of cells, the first data from the first set of cells to a second set of cells of the plurality of memory cells using a second programming mode, the second programming mode being a quad-level programming mode;
   receive, after receiving the first data, second data to be written to the one or more memory devices; and
   determine whether to write the second data to a third set of cells of the plurality of memory cells using the first programming mode or a third programming mode based at least in part on available cells of the plurality of memory cells that are ready for programming, wherein:
   the plurality of memory cells are programmable using a fourth programming mode, and
   the third programming mode and the fourth programming mode are tri-level programming modes, the third programming mode being associated with a first order for programming a lower page and one or more upper pages, and the fourth programming mode being associated with a second, different, order for programming the lower page and the one or more upper pages.

2. The memory system of claim 1, wherein the processing circuitry is further configured to cause the memory system to:
   write, based at least in part on determining to use the third programming mode, the second data to the third set of cells using the third programming mode.

3. The memory system of claim 1, wherein the processing circuitry is further configured to cause the memory system to:
   determine, based at least in part on receiving the second data, a logical saturation of the one or more memory devices, wherein a quantity of the available cells is based at least in part on the logical saturation; and
   compare the logical saturation with a threshold logical saturation.

4. The memory system of claim 1, wherein, as part of determining whether to use the first programming mode or the third programming mode, the processing circuitry is further configured to cause the memory system to:
   determine to use the third programming mode based at least in part on a logical saturation of the one or more memory devices satisfying a threshold logical saturation.

5. The memory system of claim 4, wherein the logical saturation of the one or more memory devices is based at least in part on a quantity of logical addresses of the one or more memory devices that are used relative to a quantity of logical addresses supported by the one or more memory devices.

6. The memory system of claim 1, wherein the processing circuitry is further configured to cause the memory system to:
   determine, based at least in part on receiving the second data, a quantity of the available cells; and
   compare the quantity of the available cells with a threshold quantity.

7. The memory system of claim 1, wherein, as part of determining whether to use the first programming mode or the third programming mode, the processing circuitry is further configured to cause the memory system to:
   determine to use the third programming mode based at least in part on a quantity of the available cells being less than a threshold quantity.

8. The memory system of claim 1, wherein the processing circuitry is further configured to cause the memory system to:
   perform a garbage collection operation while the second data is written to the third set of cells to make available a fourth set of cells for storing the second data.

9. The memory system of claim 1, wherein, as part of determining whether to use the first programming mode or the third programming mode, the processing circuitry is further configured to cause the memory system to:
   determine to use the third programming mode based at least in part on a rate at which unavailable cells are made available being less than a rate at which available cells are written to using the first programming mode.

10. The memory system of claim 1, wherein
    the processing circuitry is further configured to cause the memory system to:
    write, based at least in part on determining to use the third programming mode, the second data to the third set of cells using the third programming mode in accordance with the first order.

11. The memory system of claim 10, wherein the processing circuitry is further configured to cause the memory system to:

transmit a command directing the one or more memory devices to use the third programming mode based at least in part on determining to use the third programming mode.

12. The memory system of claim 1, wherein the processing circuitry is further configured to cause the memory system to:
write the second data to the third set of cells using the third programming mode based at least in part on determining to use the third programming mode; and
transfer, using the second programming mode, the second data to a fourth set of cells of the plurality of memory cells.

13. The memory system of claim 12, wherein, to transfer the second data to the fourth set of cells, the processing circuitry is further configured to cause the memory system to:
perform a first operation for reading first pages of the third set of cells to obtain a first portion of the second data; and
perform a second operation for reading second pages and third pages of the third set of cells to obtain a remaining portion of the second data.

14. A memory system, comprising:
one or more memory devices comprising a plurality of memory cells; and
processing circuitry coupled with the one or more memory devices and configured to cause the memory system to:
receive first data to be written to the one or more memory devices;
write, based at least in part on receiving the first data to be written to the one or more memory devices, the first data to a first set of cells of the plurality of memory cells using a first programming mode, the first programming mode being a single-level programming mode;
transfer, based at least in part on writing the first data to the first set of cells, the first data from the first set of cells to a second set of cells of the plurality of memory cells using a second programming mode, the second programming mode being a quad-level programming mode;
receive, after receiving the first data, second data to be written to the one or more memory devices; and
determine whether to write the second data to a third set of cells of the plurality of memory cells using the first programming mode or a third programming mode based at least in part on available cells of the plurality of memory cells that are ready for programming, the third programming mode being a tri-level programming mode,
wherein, based at least in part on determining to use the third programming mode, the processing circuitry is further configured to cause the memory system to:
program, in a first round of programming, first pages of the third set of cells using the first programming mode; and
program, in a second round of programming, second pages, third pages, or both, of the third set of cells.

15. A non-transitory, computer-readable medium storing code comprising instructions which, when executed by processing circuitry of an electronic device, cause the electronic device to:
receive first data to be written to one or more memory devices comprising a plurality of memory cells;
write, based at least in part on receiving the first data to be written to the one or more memory devices, the first data to a first set of cells of the plurality of memory cells using a first programming mode, the first programming mode being a single-level programming mode;
transfer, based at least in part on writing the first data to the first set of cells, the first data from the first set of cells to a second set of cells of the plurality of memory cells using a second programming mode, the second programming mode being a quad-level programming mode;
receive, after the first data, second data to be written to the one or more memory devices; and
determine whether to write the second data to a third set of cells of the plurality of memory cells using the first programming mode or a third programming mode based at least in part on available cells of the plurality of memory cells that are ready for programming, the third programming mode being a tri-level programming mode,
wherein, based at least in part on determining to use the third programming mode, the processing circuitry is further configured to cause the electronic device to:
program, in a first round of programming, first pages of the third set of cells using the first programming mode; and
program, in a second round of programming, second pages, third pages, or both, of the third set of cells.

16. The non-transitory, computer-readable medium of claim 15, wherein the instructions, when executed by the processing circuitry of the electronic device, further cause the electronic device to:
write, based at least in part on determining to use the third programming mode, the second data to the third set of cells using the third programming mode.

17. The non-transitory, computer-readable medium of claim 15, wherein, as part of determining whether to use the first programming mode or the third programming mode, the instructions, when executed by the processing circuitry of the electronic device, further cause the electronic device to:
determine to use the third programming mode based at least in part on a logical saturation of the one or more memory devices satisfying a threshold logical saturation.

18. The non-transitory, computer-readable medium of claim 17, wherein the logical saturation of the one or more memory devices is based at least in part on a quantity of logical addresses of the one or more memory devices that are used relative to a quantity of logical addresses supported by the one or more memory devices.

19. The non-transitory, computer-readable medium of claim 15, wherein the instructions, when executed by the processing circuitry of the electronic device, further cause the electronic device to:
determine, based at least in part on receiving the second data, a quantity of the available cells; and
compare the quantity of the available cells with a threshold quantity.

20. The non-transitory, computer-readable medium of claim 15, wherein, as part of determining whether to use the first programming mode or the third programming mode, the instructions, when executed by the processing circuitry of the electronic device, further cause the electronic device to:
determine to use the third programming mode based at least in part on a quantity of the available cells being less than a threshold quantity.

21. The non-transitory, computer-readable medium of claim 15, wherein the instructions, when executed by the processing circuitry of the electronic device, further cause the electronic device to:
perform a garbage collection operation while the second data is written to the third set of cells to make available a fourth set of cells for storing the second data.

22. The non-transitory, computer-readable medium of claim 15, wherein, as part of determining whether to use the first programming mode or the third programming mode, the instructions, when executed by the processing circuitry of the electronic device, further cause the electronic device to:
determine to use the third programming mode based at least in part on a rate at which unavailable cells are made available being less than a rate at which available cells are written to using the first programming mode.

23. A method, comprising:
receiving first data to be written to one or more memory devices comprising a plurality of memory cells;
writing, based at least in part on receiving the first data to be written to the one or more memory devices, the first data to a first set of cells of the plurality of memory cells using a first programming mode, the first programming mode being a single-level programming mode;
transferring, based at least in part on writing the first data to the first set of cells, the first data from the first set of cells to a second set of cells of the plurality of memory cells using a second programming mode, the second programming mode being a quad-level, programming mode;
receiving, after the first data, second data to be written to the one or more memory devices;
determining whether to write the second data to a third set of cells of the plurality of memory cells using the first programming mode or a third programming mode based at least in part on available cells of the plurality of memory cells that are ready for programming, the third programming mode being a tri-level programming mode; and
programming, based at least in part on determining to use the third programming mode, first pages of the third set of cells using the first programming mode in a first round of programming and second pages, third pages, or both, of the third set of cells in a second round of programming.

24. The method of claim 23, further comprising:
writing, based at least in part on determining to use the third programming mode, the second data to the third set of cells using the third programming mode.

25. The method of claim 23, wherein determining whether to write the second data to the third set of cells using the first programming mode or the third programming mode comprises:
determining to use the third programming mode based at least in part on a logical saturation of the one or more memory devices satisfying a threshold logical saturation.

* * * * *